United States Patent [19]

Benes et al.

[11] Patent Number: 4,843,246

[45] Date of Patent: Jun. 27, 1989

[54] APPARATUS FOR DETECTING THE POSITION OF INCIDENCE OF A BEAM OF CHARGE CARRIERS ON A TARGET

[75] Inventors: Ewald Benes, Biedermannsdorf; Franz Viehbock, Spitz; Herbert Stori, Vienna, all of Austria; Friedrich-Werner Thomas, Gelnhausen; Gernot Thorn, Hanau, both of Fed. Rep. of Germany

[73] Assignee: Leybold-Heraeus GmbH, Hanau, Fed. Rep. of Germany

[21] Appl. No.: 129,340

[22] Filed: Dec. 3, 1987

Related U.S. Application Data

[63] Continuation of Ser. No. 799,581, Nov. 19, 1985, abandoned.

[30] Foreign Application Priority Data

Nov. 19, 1984 [DE] Fed. Rep. of Germany ....... 3442207

[51] Int. Cl.$^4$ .............................................. G01J 1/00
[52] U.S. Cl. ................................. 250/491.1; 250/397; 250/399
[58] Field of Search ............... 250/491.1, 492.1, 492.2, 250/492.3, 397, 398, 399, 306, 307, 310; 219/121 EW, 121 EU, 121 EV, 121 EB, 121 EC, 121 ED, 121 EM; 378/370 H, 370 I, 370 GX

[56] References Cited

U.S. PATENT DOCUMENTS

| | | | |
|---|---|---|---|
| 3,207,902 | 9/1965 | Sandborg | 250/370 H |
| 3,597,577 | 8/1971 | Guittet et al. | 219/121 EC |
| 3,829,684 | 8/1974 | Assouline et al. | 250/213 R |
| 3,947,381 | 8/1976 | Rohrle et al. | 250/310 |
| 4,593,199 | 6/1986 | Yaniv et al. | 250/484.1 |

FOREIGN PATENT DOCUMENTS 38-5955   5/1963  Japan .
1105115   3/1968  United Kingdom .
2099653  12/1982  United Kingdom .

OTHER PUBLICATIONS

Siebert, "Optoelektronische Positiondetectoren PSD: Volig aufglöst," Elektronik, vol. 13, Jun. 29, 1984, pp. 84–88.
Verlag, "Positionserfassung: Detektor ausSilizium," Sounderdruck aus >>industrie-elektrik+elektronik<<, Jan. 28, 1983, No. 8.

*Primary Examiner*—Bruce C. Anderson
*Assistant Examiner*—Paul A. Guss
*Attorney, Agent, or Firm*—Davis Hoxie Faithfull & Hapgood

[57] ABSTRACT

The invention concerns apparatus for detecting the position of incidence (2) of a beam (1) of charge carriers on a target (3) wherein X-rays (4) starting from the position of incidence (2) are detected by detector (7) connected to an analyzing circuit (9) An imaging system (5, 50; 10, 11, 12) is provided which can cover all the positions ($P_1 \ldots P_8$) that the positions of incidence (2) can take up and projects them on the sensing surface of a position-sensitive detector (7), wherein the projected coordinates (x', y') are directly proportional to the coordinates (x, y) of the position of incidence (2). In addition, a filter (6) highly transparent to the X-ray radiation range emitted from the position of incidence (2) is arranged between the target surface (3) and the position-sensitive sensor (7). The position-sensitive detector (7) emits electric signals which depend from the coordinates (x, y) of the position of incidence (FIG. 1).

11 Claims, 5 Drawing Sheets

FIG.3
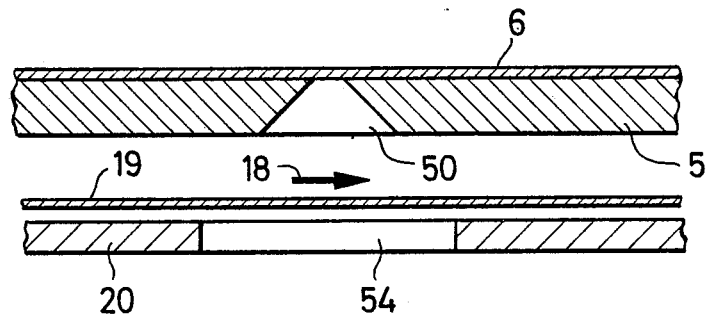
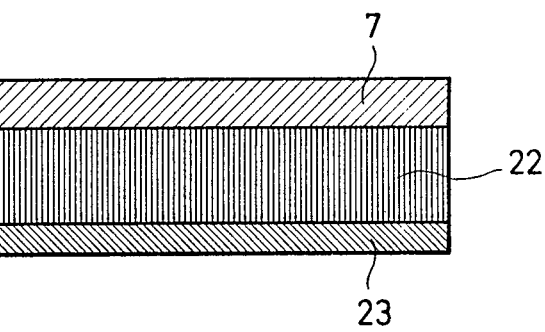
FIG.4

APPARATUS FOR DETECTING THE POSITION OF INCIDENCE OF A BEAM OF CHARGE CARRIERS ON A TARGET

This is a continuation of co-pending application Ser. No. 799,581 filed on Nov. 19, 1985, now abandoned.

The invention concerns apparatus for detecting the position of incidence of a beam of charge carriers on a target where the X-rays starting from the position of incidence are detected by a detector which is connected with an analysing circuit.

Apparatus of this type is utilised for electron beam vaporisation sources, electron beam melting plants and electron beam welding guns. In each of these named types of equipment, the accurate guidance of the electron beam is of great significance. Thus, for instance, for vaporisation sources the electron beam is guided over the surface of the material to be vaporised in such a manner that over a given surface a surface temperature of the highest possible uniformity, and thus constant rate of evaporation, is achieved. In electron beam melting plants it matters that the electron beam should not impinge on surfaces next to the material to be melted, and in electron beam welding guns the electron beam must be guided exactly along the line separating the parts to be welded. In these applications, the electron beam is deflected to the desired position by way of electric and/or magnetic fields. The position of incidence of the electron beam is adjusted dimensioning and trimming of an electric or magnetic deflection system as well as by applying suitable control variables in the form of electric voltages or currents to the deflection system. Although these voltages can be directly correlated with the desired position of the electron beam, the actual position of the beam may differ because of the time stability and the temperature sensitiveness of the deflection system.

A photoelectric control apparatus for the deflection of a beam of energy incident on the surface of a workpiece is already known from U.S. Pat. No. 3,449,542. This control apparatus has a photoelectric transducer with a light-sensitive surface extending parallel to the surface of the workpiece, the point of incidence of the energy beam being projected to this surface via a mirror system. When a spot of light falls on its surface, the transducer provides signals over two output leads in dependence on the coordinate position of the light spot. A disadvantage of this known control apparatus is that the optical imaging system it utilises readily becomes dirty and greatly attenuates the transmission of light beams. In addition, only a small region of the crucible or of the surface to be treated is projected on the transducer. This region can be varied by adjusting the position of a mirror by means of adjusting motors. The optical imaging system thus requires adjusting motors, in order to be able to process the whole surface of the workpiece. Finally, in the known control apparatus, as transducer a photocell is used which can only emit error signals, i.e. signals which indicate a deviation from a reference position. A fundamental drawback of this control apparatus operating within the visible spectrum consists also in that the position of incidence of an energy beam in the visible range is not well-defined and has poor contrast relative to the remainder of the target surface because the surface incandesces due to the thermal conductivity of the target material over an area which is considerably larger than that surface which is directly bombarded with electrons, i.e. the position of incidence of the electron beam on a glowing surface of the target material in a crucible is very difficult to make out with purely optical means.

Also, there is already known a process for regulating the actual position of a beam incidence region relative to a desired beam incidence region in an apparatus for treating a workpiece in a high-energy charge carrier beam, wherein X-rays are utilised instead of visible light (German Published Application No. 2821028). Here the desired position of the beam incidence region is determined on the basis of a differential X-ray emission of the desired region of beam incidence and a region adjacent thereto and in the case of a deviation between the actual and desired beam incidence region a corresponding error signal is produced for correcting the deviation. In this known process always two adjacent regions of different X-ray emission are considered in order to determine the desired position. Consequently, this known process fails with homogeneous materials, because in such a case the X-ray emission is approximately the same everywhere and so each actual position is also a desired position. In addition, it is not possible by means of the known process to obtain output signals which change monotonically over the whole crucible or workpiece treatment region because the X-ray sensor does not contain an imaging system. It has only a collimator, in given cases in the form of a slit stop which is transparent to beam bundles corresponding to a band-like or point-like field of view. Thus the sensor delivers a signal only when it is directed at a spot emitting X-rays i.e. when X-ray emitting spots fall within the narrow range of detection.

In the above-mentioned process a Geiger-Müller counter tube is utilised which only gives off yes/no information but the described disadvantages also arise when a semiconductor sensor is used (French Patent Publication No. 2360173). Such semiconductor ionization detectors for X-rays have been known for a long time. Essentially there are two different types which have been applied for capturing X-rays. One type is a lithium-doped germanium detector, while the other is a lithium-doped silicon detector. Because of the narrow band gap between germanium and silicon these detectors must be cooled to temperatures of down to 77° K. in order to obtain their desired properties. Si(Li) detectors are used in general for measuring X-rays in the lower energy range because their resolution is higher than that of Ge(Li) detectors. For higher X-ray radiation energies Ge(Li) detectors are preferred because they have a larger photoelectric cross-section (The New Encyclopaedia Britannica 1977, Macropaedia, Volume 19, page 1063, right-hand column).

The underlying task of the invention is to provide apparatus for detecting the position of incidence of a beam of charge carriers on a target, wherein the X-rays proceeding from the position of incidence are detected by a detector which is connected with an analysing circuit and wherein all possible positions of incidence of the beam of charge carriers are encompassed or covered precisely in accordance with their coordinates.

This task is achieved according to the invention in, that an imaging system is provided which can cover all the positions that the point of incidence can take up and projects them onto the sensor surface of a position-sensitive detector with the projected coordinates directly proportional to the coordinates of the position of incidence, and in that a filter highly transparent to the X-ray wavelength range of the radiation emitted from the position of incidence is arranged between the target surface and the position-sensitive sensor, and in that the detector delivers electrical signals which depend monotonically from the coordinates of the position of incidence.

In contrast to imaging a point of incidence with the aid of visible light beams, the advantage achieved by the invention consists particularly in that a position of incidence imaged with the aid of X-rays is clearly distinguishable from its surrounding field because X-rays will only be emitted where a beam of charge carriers is incident. When the charge carriers hit a material, they are braked and lose various fractions of their energy, creating a continuous braked radiation or bremsstrahlung at various frequencies. The continuous spectrum of the X-ray bremsstrahlung extends to a predetermined maximum limiting frequency or a short-wave limit, the spectral distribution of the radiation flux of the X-ray bremsstrahlung depending on the kinetic energies of the charge carriers, preferably electrons. It is essentially this bremsstrahlung which is exploited by the invention.

In addition to the X-ray bremsstrahlung there is also the so-called characteristic X-ray radiation which is characteristic for the material on which the charge carriers impinge. Characteristic X-ray radiation is emitted when an electron jumps into an inner shell nearer to the nucleus of an atom. For that to happen, a place must first be freed in a fully occupied shell, i.e. some excitation must occur, which requires relatively large energy. This energy may, for instance, be supplied by electron impact. The impinging charge carriers must therefore be very fast, i.e. accelerated by high voltages (depending on the material, approximately between 2 kV and 60 kV). The characteristic X-ray radiation is recognisable as a line spectrum which is superimposed on the continuous spectrum of the bremsstrahlung. The characteristic radiation may in principle also be used for realising the invention. However, in comparison with the X-ray bremsstrahlung it is of less significance for the invention.

Preferred embodiments of the invention are illustrated in the drawings and will be described below in greater detail, wherein:

FIG. 3 is a stop with filter foil;

FIG. 4 is a light-conducting plate arranged between a sensor and a fluorescent layer;

Figure 1:
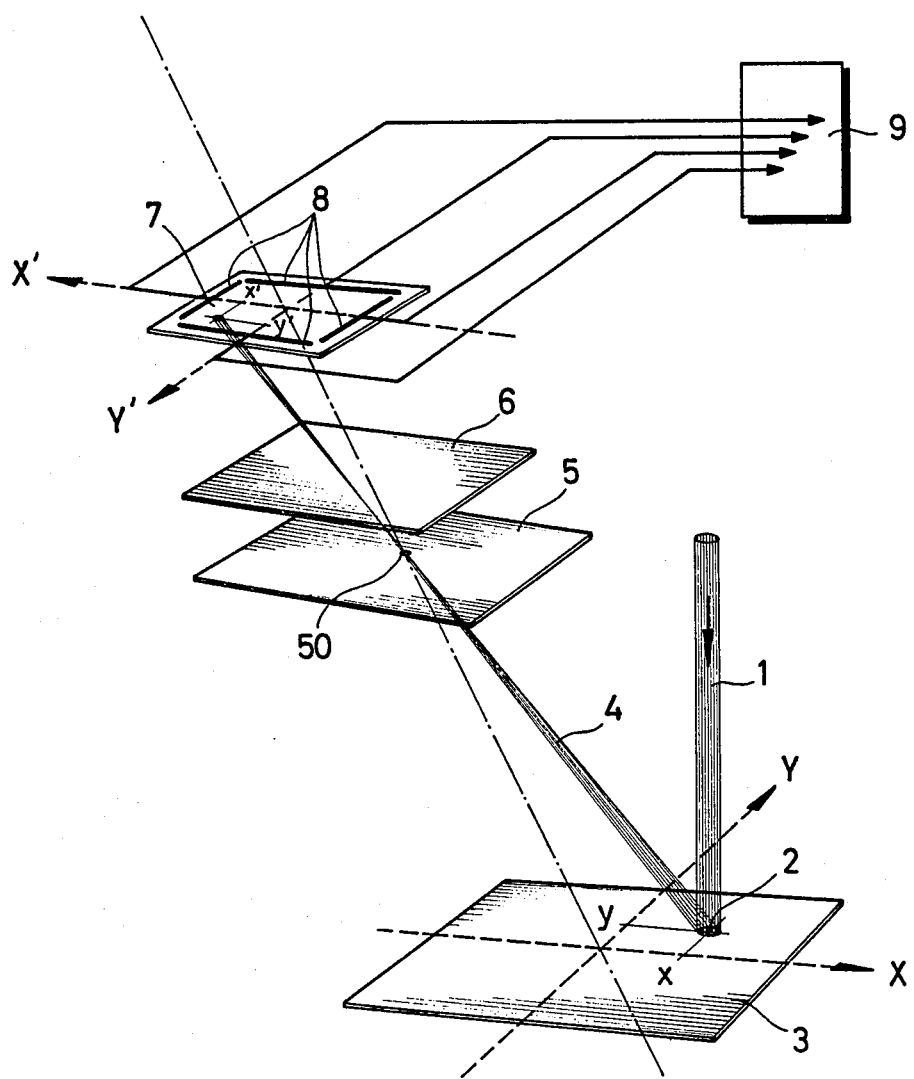
FIG. 1 is a representation of the principle of the invention wherein a pinhole diaphragm (stop) is provided between the point of incidence of an electron beam and a sensor.

In the illustration of the principle in FIG. 1 an electron beam 1 is shown which is incident at a position 2 on a target material 3. X and Y designate the coordinate axes which define the coordinates x and y of the position of incidence. X-rays are emitted from the position of incidence 2 and of these only the X-ray bundle 4 is shown. Both the emitted characteristic X-ray radiation and the X-ray bremsstrahlung are directly proportional to the density of the electrons impinging on the target material. The X-rays are emitted from the position of incidence 2 only, wherein the maximum intensity of the emitted X-ray radiation, in accordance with the usual Gaussian distribution, is at the centre of the position of incidence 2 of the electron beam 1.

The bundle 4 of X-rays starting from the position of incidence 2 passes through a pinhole stop 5 as well as a filter foil 6. This filter foil 6 is made, for instance, of an aluminium foil of a few micrometer thickness which allows the X-ray to pass through with little attenuation. After the bundle 4 of X-rays has passed through the foil 6 it is imaged on a position-sensitive detector 7. This position-sensitive detector may be a diode matrix arrangement, a CCD (charge-coupled devices) arrangement, a lateral diode or some other suitable component.

It is particularly expedient to use semi-conductor diodes for detecting the image of the position of incidence 2 of the electron beam 1 projected through the pinhole stop 5 and in the simplest case their direct X-ray sensitivity may be utilized. Open photodiodes without covering glass and with a thickest possible barrier layer are well suited for this purpose. However, since these are sensitive in the visible spectral range and to a small extent also in the infrared and ultraviolet ranges and since these ranges of the electromagnetic radiation do not carry any usable picture information, the foil 6 is provided between the position of incidence 2 of the electron beam 1 and the detector 7. It has proved particularly advantageous for realising the invention to use optical position detectors the measurement principle of which is based on lateral photo-effects at the surface of a PIN diode of large surface area. Such position detectors give signals for the X and Y directions (see H. P. Siebert, Optical Position Dectors PSD: 'Fully resolved ...', in the journal ELEKTRONIK No. 13, 1984, pages 84 to 88; Journal 'Industrie-Elektrik+elektronik', 1983, No. 8, pages 21, 22). Their mode of operation will be explained in greater detail in conjunction with the more detailed description of the analysing circuitry given below.

In the preferred embodiment of FIG. 1 the pinhole principle is used for imaging the X-ray bundle 4 starting from the position of incidence 2. However, for this purpose imaging systems according to the Fresnel zone principle or the X-ray lens principle may also be used. X-ray lenses have already been used for a long time in X-ray microscopy; they consist of bodies of rotational symmetry with applied crystal layers. The pinhole camera principle is however particularly simple and problem-free. The size of the stop aperture 50 in the diaphragm 5 is a result of the compromise desired between high local resolution in the case of a small aperture 50 and a sufficient X-ray flux in the case of a large aperture 50. The scale of imaging, i.e. the ratio of the coordinates x' and y' of the image to the coordinates x and y of the object is equal to the ratio of the distances between the aperture 50 and the detector 7 on the one hand and the aperture 50 and the surface of the target material 3 on the other. In FIG. 1 only one pin stop 5 is shown. However, two pinhole stops may also be provided of which one serves for imaging the X-coordinate and the other for imaging the Y-coordinate. The signals produced by the detector 7 are passed to the electrodes 8 of an analysing circuit 9 which delivers currents or voltages proportional to the image coordinates x', y'.

Figure 2:
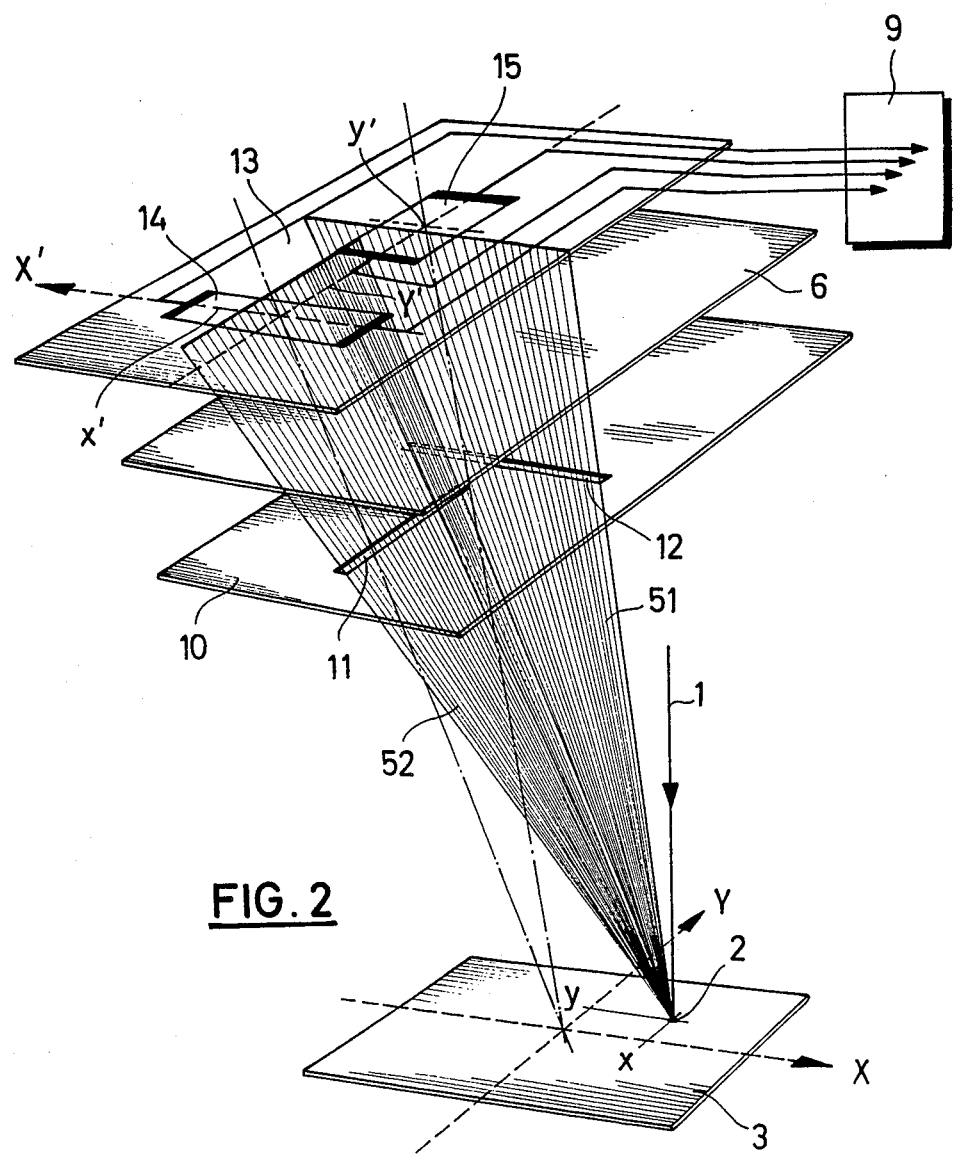
FIG. 2 is a further illustration of the principle of the invention, wherein a slit diaphragm (stop) is provided between the point of incidence of an electron beam and a sensor.

In FIG. 2 the electron beam 1 is represented with a vanishing diameter for simplifying the representation. The X-rays starting from the position of incidence 2 of the electron beam 1, of which only two bundles 51 and 52 are shown, are spread out over a slit stop 10, which contains two mutually perpendicularly arranged slits 11 and 12, and are given via a filter foil 6 to a detector 13 containing two sensors 14 and 15 of mutually perpendicular longitudinal axes. The sensors 14, 15 are connected with the analysing circuitry 9. The width of the slits 11, 12 is once again a result of a compromise between local resolution and intensity. The length of the slit 11 is so chosen that in every case sufficient X-ray radiation should fall on the sensor 15. The two slits 11, 12 of the slit stop 10 image the point of incidence 2 of the electron beam 1 on the sensors in a sense which is not exactly photographic imaging. Therefore, by 'imaging' in the sense of the invention it is not only camera-like imaging that is to be understood but also imaging in which the coordinates of the point of incidence 2 of the electron beam correspond to the centre of gravity of the local electrron beam density distribution on the target surface 3. By 'centre of gravity' is meant here the geometrical centre point, i.e. a curve with two or more humps. The slit 11 serves for imaging the x coordinates on the sensor 14 while the slit 12 is provided for imaging the y coordinates of the sensor 15.

FIG. 3 shows the filter foil 6 together with the pinhole stop 5. The filter foil 6 is preferably of aluminium while the pinhole stop 5 may be of lead or tantalum. The filter foil 6 and the pinhole stop 5 are laid closely adjacently to each other.

The combination of filter foil 6 and pinhole stop 5 may be used in an advantageous manner as a vacuum-tight separating well between the high vacuum of the target or electron beam chamber and the detector 7 which is disposed expediently in a normal atmosphere. A protective foil 19 is disposed between the pinhole stop 5 and a vaporisation stop 20. Arrow 18 indicates the direction of movement of this foil 19. The protective foil 19 may in given cases also be carried into practice as a foil to receive vapour deposition. The target material is disposed beneath the vaporisation stop 20, while the detector system is disposed above the protective foil 6. The vaporisation stop 20 effects a reduction in the surface of the foil 19 to receive vapour. The choice of the diameter of the vaporisation stop opening 54 is limited in the sense of a minimum in that the vaporisation stop 20 should not provide any shielding for the X-rays required for imaging the position of incidence 2 of the electron beam 1.

FIG. 4 shows an embodiment of the detecting apparatus. Beneath the detector 7 a light-conducting plate 22 is provided, of which only two light-conducting fibres 55, 56 are provided with reference numbers. This light-conducting plate 22 does not allow any refraction but rather leads the light vertically upwardly from below. Reference number 23 designates a fluorescent layer disposed beneath the light-conducting plate 22. This fluorescent layer 23 converts X-rays into visible light so that the detector 7 is subjected only to visible light obtained from the X-rays. In this way the X-ray loading of the detector is reduced and radiation damage to this detector is thus prevented. By using the fluorescent layer 23 which responds exclusively to X-rays the need for an additional filter which is transparent to X-rays only may be obviated. In this case, to a certain extent the fluorescent layer is itself a filter because it only allows X-rays to pass through, and moreover to do so in a converted form. The fluorescent layer 23 may also be seen as a Stokes' frequency converter which converts high frequencies to lower frequencies.

In order to obtain output voltages which are strictly proportional to the x and y coordinates, the invention provides that it is best of all to use as detectors two-dimensional lateral diodes which are also known under the designation PSD (=position-sensitive detectors), where imaging with only a pinhole stop is concerned. If, on the other hand, two pinhole stops or two slit stops are used for imaging, then as a detector preferably a one-dimensional lateral diode for one coordinate and another one-dimensional lateral diode for another coordinate are used. By lateral diodes one is concerned with large-area PN, PIN or Schottky diodes in which a part of the light quanta absorbed in the barrier layer produces an electron-hole pair or pairs. These charge carriers are distributed over the electrodes according to their distance from the electrodes at the edge of the layer, whereby deductions can be made from the ratio of the electrode currents about the location of the incidence of the light quantum. Hitherto, these diodes have only been used in the visible range of the electromagnetic radiation; however, they also display sufficient direct sensitivity in the X-ray range for utilisation according to the invention. Si lateral diodes show a maximum of direct X-ray sensitivity for a quantum energy of about 10 keV, and for higher quantum energies GaAs lateral diodes display a significantly higher quantum yield than Si lateral diodes. Hence GaAs lateral diodes are used with advantage for higher quantum energies and lower X-ray intensities.

Figure 5:
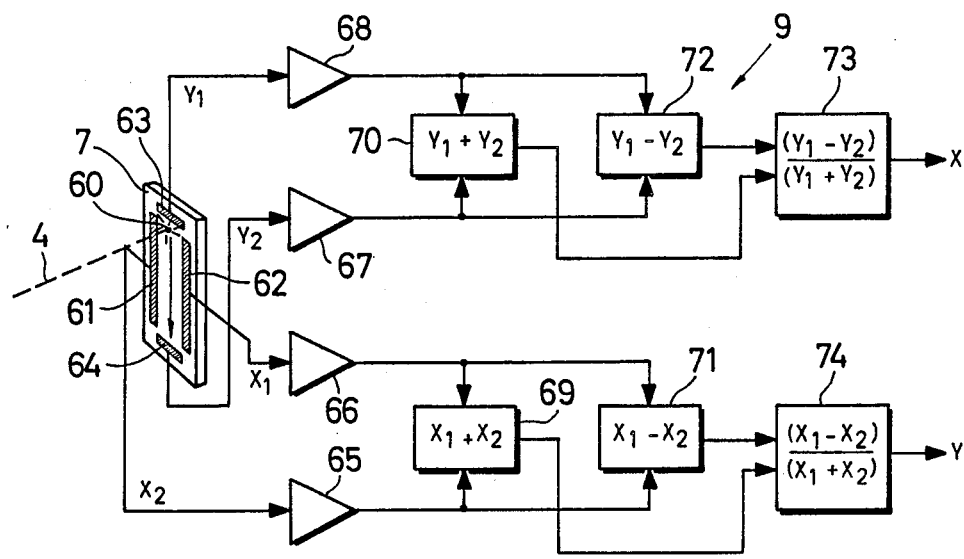
FIG. 5 is a two-dimensional lateral diode with analysing circuitry.

FIG. 5 is a block diagram of an analysing circuit which analyses the signals of a two-dimensional lateral diode. This analysing circuit is already known in itself for use in the visible range of electromagnetic radiation (see 'industrie-elektrik+elektronik', ibid. page 22).

A bundle 4 of X-rays falls on a point 60 of the detector 7 which is formed as a two-dimensional lateral diode and has four electrodes 61, 62, 63, 64. The electrodes 61, 62, are here associated with the x-coordinates while the electrodes 63, 64 are associated with the y-coordinates. All electrodes 61–64 are connected with preamplifiers 65, 68 which lead to addition circuits 69, 70 and subtraction circuits 71, 72. In these circuits 69–72 each of the output signals of the detector 7, considered by themselves are associated with the x and y-coordinates are added or subtracted. The output signals of the addition circuit 70 and the subtraction circuit 72 are passed to a divider 73 which divides the output signal of the subtraction circuit 72 by the output signal of the addition circuit 73. By this division the intensity dependence of the signals is eliminated and a signal appears at the output of the divider 73 which depends only on the X-coordinate.

The signal processing for the Y-coordinate takes place in a corresponding manner. Here the output signals of the pre-amplifier 65, 66 are added or subtracted and thereafter in a divider 74 the output signals of the subtractor 71 are divided by the output signals of the adder 69. Then a signal 74 appears at the output of the divider 74 which is no longer dependent on the intensity of the beam incident at the point 60 but rather is dependent only on the Y-coordinate of this point 60.

Figure 6:
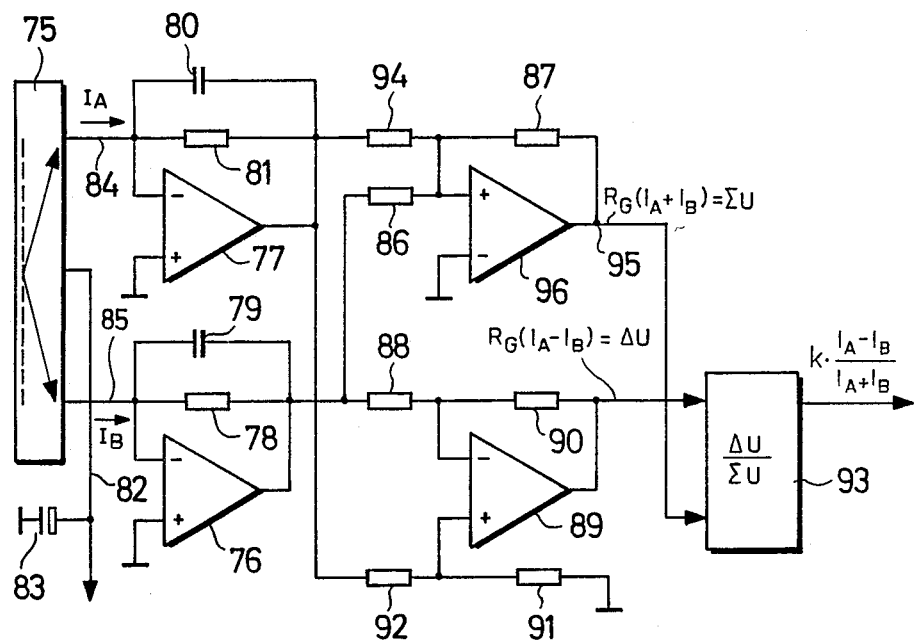
FIG. 6 is a one-dimensional lateral diode with analysing circuitry.

FIG. 6 shows a circuit arrangement containing a one-dimensional lateral diode 75 which enables a coordinate to be covered. Two of these lateral diodes 75 may, for instance, be used in the apparatus according to FIG. 2. The circuit connected downstream of the lateral diode 75 corresponds in essence with the lower or upper branch of the circuit shown in FIG. 5. The centre point of the lateral diode 75 is subjected to a bias voltage via a lead 82 and a capacitor 83, the diode having two outputs 84, 85 of which one output 84 conveys the current $i_A$ and the other output 85 conveys the current $i_B$. The current $i_A$ arrives at a preamplifier 77 which has a feedback branch in the form of a parallel connection consisting of a resistor 81 and a capacitor 80. Correspondingly, the current $i_B$ is fed to a preamplifier 76 with a feedback branch in the form of a parallel connection consisting of a resistor 78 and a capacitor 79. The output of the preamplifier 77 is connected via a resistor 94 to a positive input of an adder-amplifier 96. At the same positive input of the adder-amplifier 96 the output of the preamplifier 76 is also connected via a resistor 86. The output signals of the two preamplifiers 76, 77 are thus added in the adder-amplifier 96 which latter has a feedback resistor 87, i.e. a signal proportional to the sum $i_A+i_B$ appears at the output of the adder-amplifier 96.

The output 95 of the preamplifier 76 is also fed via a resistor 88 to the negative input of a subtraction-amplifier 89 which has a resistor 90 in its feedback branch. The positive input of the subtraction amplifier 89 is grounded via a resistor 91 and is connected via a further resistor 92 with the output of the pre-amplifier 76. By means of this connection the output signals of the two preamplifiers are subtracted from one another, and more particularly $i_B$ from $i_A$.

The addition and subtraction circuitry shown in FIG. 6 have for a long time now formed part of the state of the art and will not therefore be described in greater detail (see Beuth/Schmusch; Basic Electronic Circuits, Volume 3, 4th Edition, 1981, pages 144–147).

The output signals of the addition and subtraction amplifiers 96, 89 are again fed to a divider 93 as in FIG. 5 which divides the difference signal by the addition signal. A signal then appears at the output of this divider which signal is associated with one coordinate, for instance the x-coordinate.

The output signals of the divider 73, 74 (FIG. 5) and 93 (FIG. 6) may for instance be used for an exact coverage of the actual position of the position of incidence 2 of the electron beam 1 on the target material. In their turn, these actual positions may again be used to steer the electron beam by way of a regulating circuit to a desired position. It is also possible to display the instantaneous actual positions on a television screen or to carry out any other suitable treatment of these positions. Since electrical control values appear at the outputs of the adders 69, 70, 85 and subtractors 71, 72, 89 which electrical values still depend on the intensity of the electron beam 1, these values may advantageously be used for regulating the electron current to a desired value. This takes place in its simplest form by controlling the emission current of an electron beam gun at constant accelerating voltage.

The intensity-dependent values may also be used to control the movement of the foil 19, and moreover in such a manner that the X-ray beam intensity incident on the detector system should not fall below permissible limiting value. On attaining a limiting value of the intensity-dependent magnitude proportional to the lower X-ray intensity threshold value an increase of the velocity of continuous protective foil movement or the instantaneous transport of a piece of unvaporised protective foil into the region of the opening of the vaporisation stop may be triggered off.

The above-described preferred embodiments of the invention may also be augmented without departing from the scope of protection of the invention. For instance, when no proportionality between the x and y coordinates and the output voltages or currents of a position detector is required and the electron beam may only be moved within the immediate vicinity of a fixed target point, then in the case of a single pin stop the sensor may consist of a four-quadrant photodiode. In the case of a double pin or slit stop it is possible to utilise a detector in the form of two mutually perpendicularly arranged two-quadrant photodiodes, wherein each photodiode is associated with one of the stops. By quadrant photodiodes a corresponding arrangement of discrete diodes is also meant here.

Figure 7:
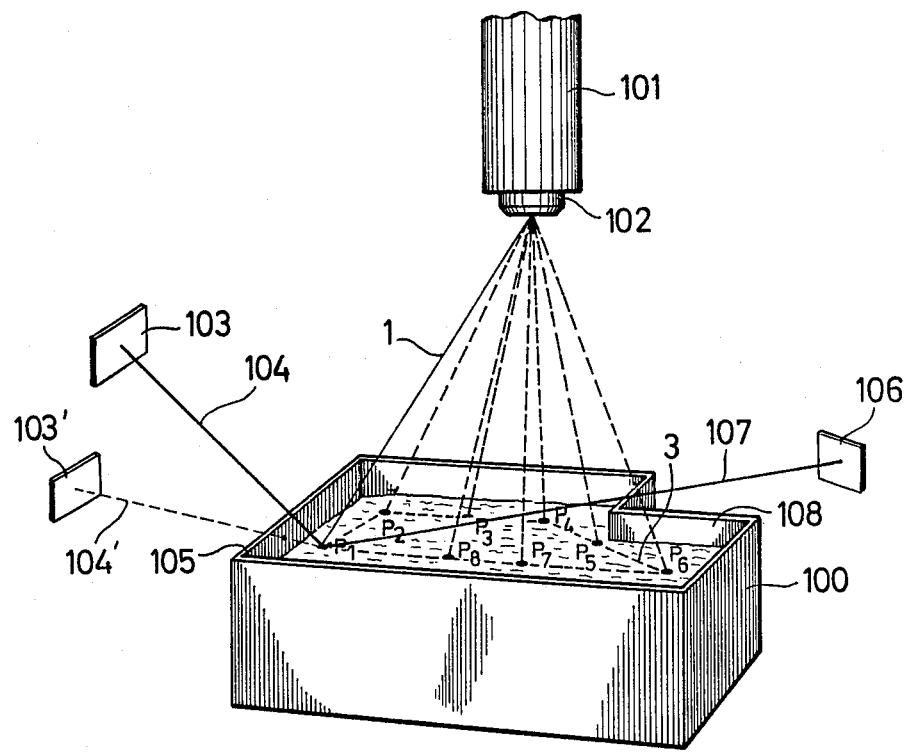
FIG. 7 is a crucible with target material and an incident electron beam, several detectors being provided.

As already mentioned, with the aid of the invention all relevant positions of incidence of the electron beam 1 on the target material 3 are covered. In FIG. 7 this target material 3 is shown in a crucible 100. On the surface of the target material 3 various points of incidence $P_1 \ldots P_8$ are shown at which the electron beam successively impinges. The positions of the electron beam 1 coming from an electron beam gun 101 and deflected by a deflection system 102, are associated with points of incidence impingement points $P_2 \ldots P_8$ which are shown in FIG. 7 by dotted lines.

If a detector 103 is arranged in the position shown in FIG. 7 it can encompass all the points of incidence $P_1 \ldots P_8$. For instance the X-ray bundle 104 starting from the point $P_1$ is fully captured by it. Should, however, the detector be arranged in a position indicated by the reference number 103', then the X-ray beams must penetrate through the crucible wall 105 in order that they may reach the detector 103'. In general, this is not problematic since sufficient X-ray radiation penetrates through the crucible wall 105, which is indicated by the bundle of radiation 104'.

In the case where the X-ray beams are attenuated too strongly by the crucible wall 105 a further detector 106 may be arranged on the opposite side which monitors the angle which is a blind angle for the detector 103'. The radiation bundle 107 starting from the point of incidence $P_1$ here passes to the detector 106 without passage through the crucible wall 108.

In a corresponding manner more than two detectors may be provided at several locations. The output signals of these detectors may be compared with each other, whereby any possible measurement errors are eliminated. It is also possible to carry out an averaging of the measurement data of different detectors.

We claim:

1. Apparatus for detecting the absolute position of incidence of a beam of charged particles impinging on a target and producing x-ray radiation at the point of incidence, the apparatus including an imaging system comprising:

a diaphragm arranged in proximity to the target and containing at least one aperture therethrough permitting the passage of x-ray radiation from the point on the target where it is produced to a stationary detector;

the detector being positioned on the opposite side of the diaphragm from the target and having a planar surface of sufficient area to intercept any x-ray radiation from the diaphragm and at least one sensing device for sensing the x-ray radiation impinging on any location on the detector surface and for producing in response thereto two signals, one of which depends monotonically on a first coordinate of the location of incidence on the detector surface of the radiation and the other of which depends monotonically on a second coordinate of the location of incidence on the detector surface of the x-ray radiation;

an analyzing circuit for receiving the signal from the sensing device; and a filter which is highly and selectively transparent to x-ray radiation, interposed between the diaphragm and the detector.

2. The apparatus of claim 1 wherein the sensing device is a two-dimensional lateral diode with four electrodes.

3. The apparatus of claim 1 wherein the sensing device is a four-quadrant photodiode.

4. Apparatus for detecting the absolute position of incidence of a beam of charged particles impinging on a target and producing x-ray radiation at the point of incidence, the apparatus including an imaging system comprising;

a diaphragm arranged in proximity to the target and containing two mutually perpendicularly arranged slits therethrough permitting the passage of x-ray radiation from the point on the target where it is produced to a stationary detector, one of which slits is provided for imaging the X-coordinate of the x-ray radiation and the other of which slits is for imaging the Y-coordinate of the x-ray radiation;

the detector being positioned on the opposite side of the diaphragm from the target, and having a surface of sufficient area to intercept any x-ray radiation from the diaphragm and a sensing device comprising two one-dimensional position-sensitive detectors for respectively detecting the X and Y coordinates of the x-ray radiation incidence on the detector surface and for producing in response thereto a signal which depends monotonically on the location of incidence on the detector surface of the radiation;

an analyzing circuit for receiving the signal from the sensing device; and a filter which is highly and selectively transparent to x-ray radiation interposed between the diaphragm and the detector;

wherein the length of the slits in the diaphragm is predetermined so that the entire width of each one-dimensional position-sensitive detector in the sensing device is illuminated by x-ray radiation from any incidence point on the target.

5. The apparatus of claim 1 wherein the filter and the target are located in a region of partial vacuum; the detector is in a region of atmospheric pressure; and the diaphragm and the filter compose the separating wall between the two regions.

6. The apparatus of claim 1 wherein the filter is a transducer which converts x-ray radiation into longer-wavelength radiation.

7. The apparatus of claim 6 wherein a fluorescent layer is arranged closely in front of the detector surface for transforming x-ray radiation into electromagnetic radiation having a wavelength for which the detector is sensitive.

8. The apparatus of claim 7 wherein a light-conducting plate is positioned between the detector surface and the flourescent layer.

9. The apparatus of claim 1 further including a protective foil positioned between the target and the diaphragm to prevent vaporization of the diaphragm and the filter.

10. The apparatus of claim 9 wherein the protective foil is movable relative to the diaphragm.

11. The apparatus of claim 10 wherein the movement of the foil is controlled by a signal dependent on the intensity of the x-ray radiation received by the detector.

* * * * *